United States Patent [19]
Twigg et al.

[11] Patent Number: 5,788,526
[45] Date of Patent: Aug. 4, 1998

[54] INTEGRATED CIRCUIT TEST SOCKET HAVING COMPLIANT LID AND MECHANICAL ADVANTAGE LATCH

[75] Inventors: Richard Dean Twigg, Columbia; Steven Dale Mitchem, Jefferson City, both of Mo.

[73] Assignee: Minnesota Mining and Manufacturing Company, Saint Paul, Minn.

[21] Appl. No.: 683,752

[22] Filed: Jul. 17, 1996

[51] Int. Cl.⁶ .................................................. H01R 13/62
[52] U.S. Cl. ................................... 439/331; 439/358
[58] Field of Search ...................... 439/70–73, 266–269, 439/330, 331, 350, 358, 372

[56] References Cited

U.S. PATENT DOCUMENTS

| | | |
|---|---|---|
| 4,378,139 | 3/1983 | Griffin et al. |
| 5,247,250 | 9/1993 | Rios. |
| 5,306,167 | 4/1994 | Nagumo. |

FOREIGN PATENT DOCUMENTS

| | | |
|---|---|---|
| 59-107544 | 6/1984 | Japan. |
| 61-43453 | 3/1986 | Japan. |
| 62-76274 | 4/1987 | Japan. |
| 4-12284 | 1/1992 | Japan. |
| 4-154064 | 5/1992 | Japan. |
| 4-155788 | 5/1992 | Japan. |
| 4-155789 | 5/1992 | Japan. |
| 4-162755 | 6/1992 | Japan. |
| 4-194680 | 7/1992 | Japan. |
| 5-275575 | 10/1993 | Japan. |
| 6-104354 | 4/1994 | Japan. |

*Primary Examiner*—Khiem Nguyen
*Attorney, Agent, or Firm*—Matthew B. McNutt

[57] ABSTRACT

A test socket for integrated circuits includes a base, a lid, and a latch providing a mechanical advantage. The base includes a nest which may move translationally and rotationally relative to the base. The nest is biased upward by coil springs mounted in the base. Spring-loaded contact pins extend through the base and the nest to make electrical connections between the integrated circuit and a circuit board to which the test socket is attached. The base also includes a nest support mounted below the nest to limit the downward travel of the nest to a selected distance. Furthermore, the nest has legs which connect to the base in a manner that limits upward travel to a selected distance. The lid includes a pressure pad which may move translationally relative to the lid. The pressure pad is spring-loaded by means of a flat spring contacting a ramp formed on the top side of the pressure pad in an inverted V-shape. The pressure pad can move vertically within the lid, thereby accommodating varied integrated circuit thicknesses. A link is pivotally attached at one end to the lid and at the other end to a latch for securing the lid in a closed position. The link provides a significant mechanical advantage in forcing the lid downward and closed to ensure good electrical contact between the integrated circuit device and the contact pins of the test socket.

19 Claims, 5 Drawing Sheets

INTEGRATED CIRCUIT TEST SOCKET HAVING COMPLIANT LID AND MECHANICAL ADVANTAGE LATCH

BACKGROUND OF THE INVENTION

1. Technical Field

The present invention pertains generally to devices that test integrated circuits, and more particularly to an improved test socket which is capable of making, on a repetitive basis, reliable connections between the integrated circuit leads and the contact pins of the test socket.

2. Description of the Prior Art

Critical integrated circuits are tested at elevated temperatures before being installed in a product because it has been found that a vast majority of these circuits, if prone to failure, will fail in a very short test period. These integrated circuits are frequently encapsulated in rectangular ceramic or plastic packages that have contact pads or leads, which pads or leads are electrically connected to the integrated circuit. To test the integrated circuit, it is necessary to make temporary electrical connections to the contact pads or leads on the integrated circuit package. Test sockets created for this purpose are soldered to printed circuit boards having the appropriate circuitry for testing a particular integrated circuit.

Most prior designs include a lid that is hinged along one edge of the test socket base and is intended to clamp the integrated circuit down onto the contact pins of the test socket as the lid is closed. Unfortunately, it has been found that the hinged lid creates dynamic components of force exerted in a non-normal direction during closure. Here, the normal direction is defined by a vector perpendicular to the plane of the test socket. Any applied force in other than the normal direction may result in movement of the integrated circuit relative to the contact pins of the test socket. This movement may damage the contact pads or leads of the integrated circuit, crack or break the ceramic or plastic encapsulating the integrated circuit. One solution to this problem is illustrated in U.S. Pat. No. 5,247,250, which is assigned to the assignee of the present invention and is incorporated herein by reference. This prior invention allows rotational and translational movement of the integrated circuit platform. Although this prior invention allows the platform to move, it would be desirable to have some support underneath the platform to stop its downward motion at a selected position. In addition, a test socket lid with compliance would accommodate an integrated circuit with the maximum thickness allowable in the tolerance specifications.

As the number of leads of the integrated circuit device increases, the combined spring force generated by the socket contacts becomes large and a great deal of force must be applied to the lid to latch it. It would be helpful to provide some means of obtaining a mechanical advantage in forcing the integrated circuit device downwardly into contact with the contact pins of the test socket. Depending on the circumstances of the testing environment, it may be more favorable to have two separate mechanisms, one for securing the lid closed and another for providing a mechanical advantage in forcing the integrated circuit towards the contact pins. On the other hand, it may be better in some situations to have a test socket with a single mechanism for both latching the lid closed and creating the mechanical advantage.

SUMMARY OF THE INVENTION

The present invention improves on the socket of U.S. Pat. No. 5,247,250 in several ways. First, the base and platform of the test socket have the freedom of rotational and translational motion provided in the prior art, but a portion of the lid also allows vertical translational movement of the lid relative to the integrated circuit. This feature prevents damage to integrated circuits meeting the maximum thickness tolerance while still applying sufficient force to the circuit to make a reliable connection. This portion of the lid comprises a pressure pad with a ramp extending from its top side in an inverted V-shape, wherein the pressure pad is placed in a lid frame and can travel up and down within the frame. A flat spring is then secured across the ramp by means of a lid cover connected to the lid frame and enclosing the flat spring and the pressure pad. The lid cover has an aperture that allows sufficient flexure of the flat spring to accommodate vertical movement of the pressure pad.

Second, the present invention provides a means of multiplying the force applied while closing the lid by utilizing a latch mechanism that creates a mechanical advantage. This mechanical advantage is provided by attaching at least one link between the latch and the lid, wherein the lengths of the latch and the link are significantly different.

Finally, the separate nest and nest support of the separate invention provide a means for stopping the downward movement of the nest or platform at a selected distance. In addition, the nest support avoids any potential damage to the legs depending downward from the nest by preventing them from contacting the lower surface of the base.

BRIEF DESCRIPTION OF THE DRAWINGS

The present invention will be more particularly described with reference to the accompanying drawings, wherein like numbers refer to like parts in the several views, and wherein.

DETAILED DESCRIPTION OF PREFERRED EMBODIMENT

Figure 1:
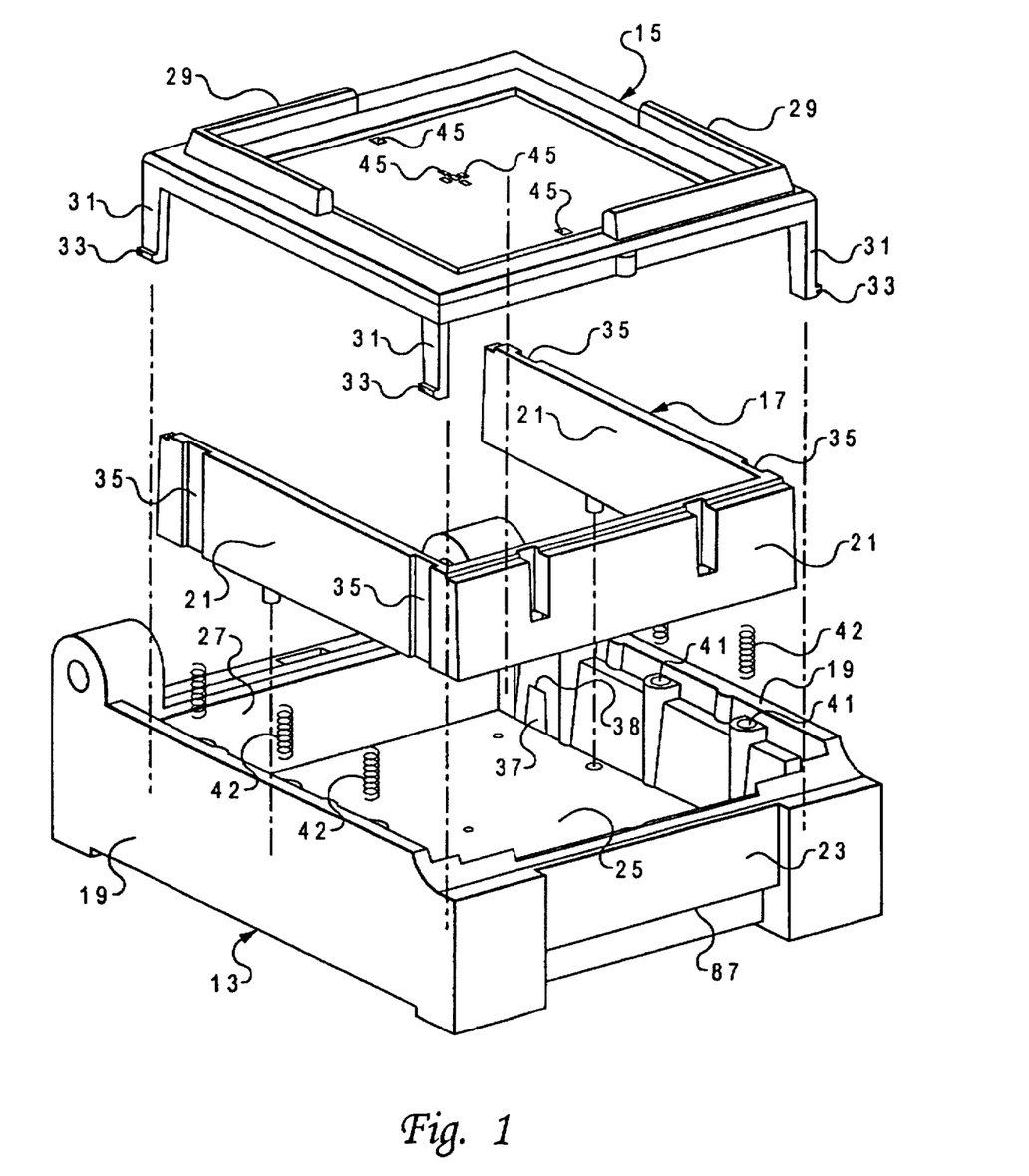
FIG. 1 is an exploded, perspective view of the base, the nest support, and the nest of the present invention.

FIGS. 1–5 illustrate the test socket 11 of the present invention. Referring to FIG. 1, an improved base 13 is shown in an exploded view with a nest 15 and nest support 17. The base 13 is comprised of a generally square, flat floor or lower surface 25 from which two side walls 19, a front wall 23, and a back wall 27 extend upwardly to define an open interior space.

Figure 5:
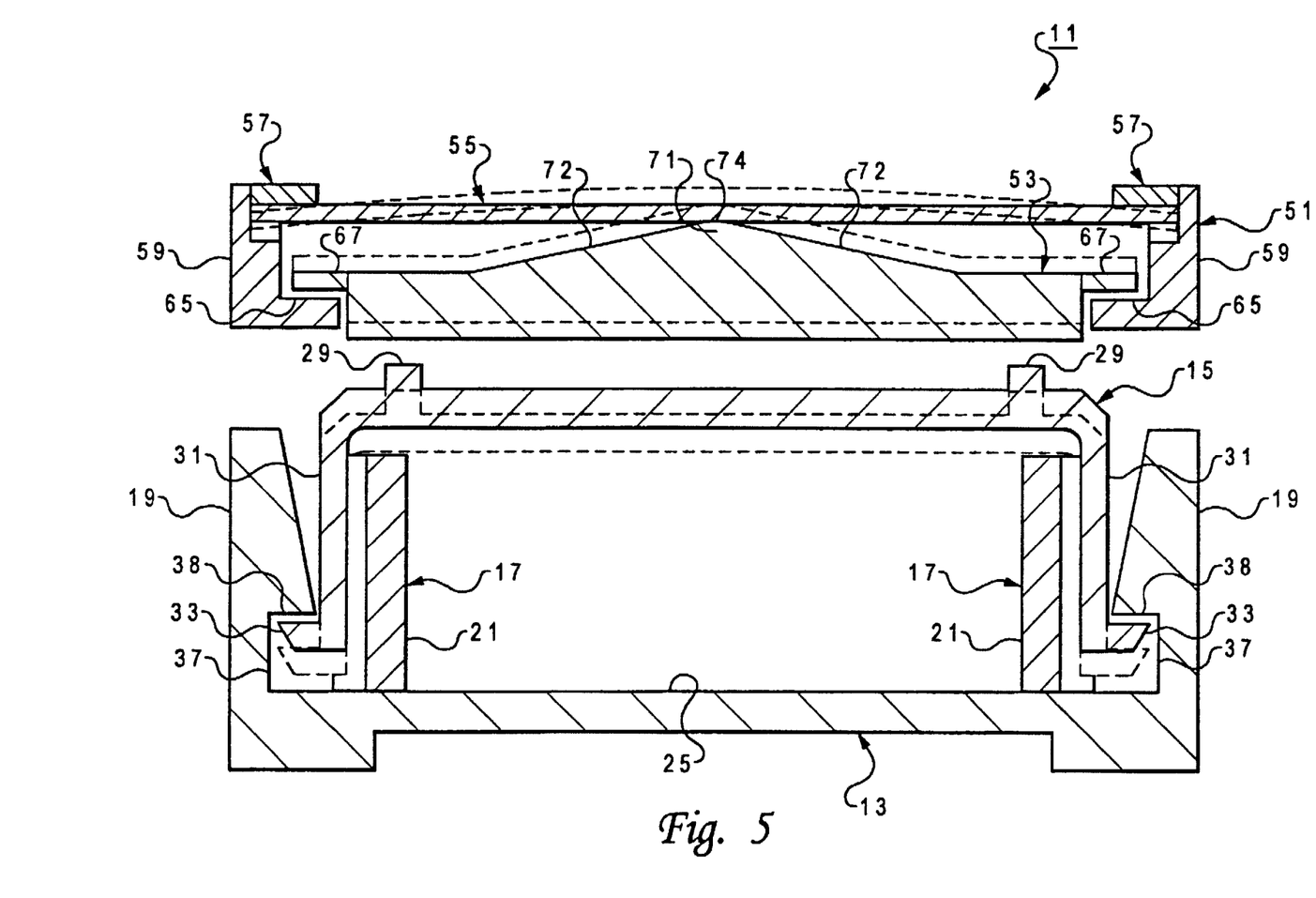
FIG. 5 is a sectional view of the present invention, taken along the line V—V of FIG. 4.

A nest support 17 is shaped to the general contour of the open interior space created by the walls of base 13 and located within base 13. Nest support 17 has only three support walls 21 and acts as a vertical lower stop for nest 15. Nest support 17 rests on the flat lower surface 25 of base 13. Nest 15 has two alignment ridges 29 which define a nest for the integrated circuit (not shown). Also, there are four legs 31 extending downward from the flat portion of nest 15 that terminate in outwardly projecting ends 33. These legs 31 fit into slots 35 in nest support 17, and leg ends 33 engage recesses 37 in the base side walls 19. Each recess 37 has a shoulder 38 (see also FIG. 5) at its upper end and extends a distance toward the lower surface 25 of base 13. Slots 35 permit any or all of the legs 31, and thus nest 15, to move toward the lower surface 25 of base 13 and only a certain distance away from the lower surface 25. As a result, nest 15 is free to "float" relative to base 13; that is, any portion of nest 15 may be depressed slightly relative to base 13 independently of any other portion of nest 15. Thus nest 15 is free to tilt slightly in any direction in response to forces unevenly applied to the integrated circuit. As shown in FIG. 5, the height of nest support 17 is greater than the length of legs 31, such that leg projections 33 will not contact floor 25 when nest 15 is pushed to its lowest position.

Nest 15 is supported above the lower surface 25 of base 13 by six coil springs 42 shown in FIG. 1. There are six cylindrical holes 41 formed in base 13 for seating the six coil springs 42, three on each side wall 19. springs 42 are positioned between base 13 and nest 15 to apply an upward force to nest 15. Coil springs 42 bias nest 15 in an upward direction at a rest position.

A large number of contact pins 39 (one shown in FIG. 4) electrically connect the integrated circuit to an external circuit board (not shown). These contact pins 39 are created from a resilient, electrically conductive metal such as copper and are formed with a bowed central portion 43 to provide the contact pins 39 with a spring action. Contact pins 39 extend through slots or holes 45 in nest 15 (also shown in FIG. 1) to contact solder balls formed on the integrated circuit. The ends of contact pins 39 opposite the integrated circuit are formed as blades 47 which extend through the lower surface 25 of base 13 for electrical connection to holes in the circuit board to which test socket 11 is attached. Contact pins 39 are retained relative to nest 15 and base 13 by shoulders fitting within enlarged slots or counterbores formed in both base 13 and nest 15.

Figure 2:
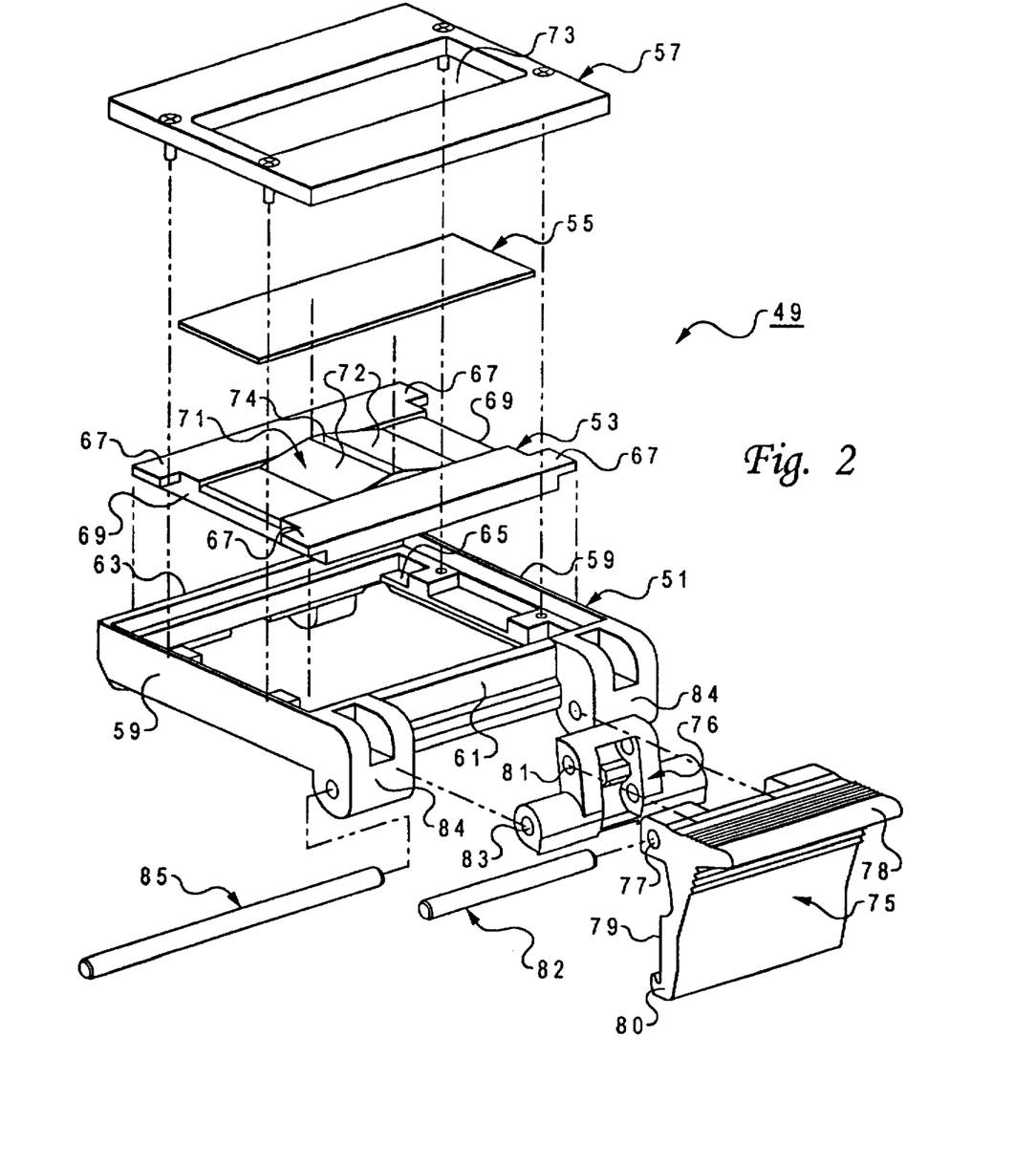
FIG. 2 is an exploded, perspective view of the lid of the present invention, including the lid frame, the pressure pad, the flat spring, the lid cover, the link, and the latch.

FIG. 2 illustrates an improved lid 49 primarily comprised of a lid frame 51, a pressure pad 53, a flat spring 55, and a lid cover 57. Lid frame 51 has a generally square shape with two side walls 59, a front wall 61, and a back wall 63, forming an open space through its interior. There are four seating slots 65 in lid frame 51 for seating pressure pad 53, one at each end of each side wall 59.

Still referring to FIG. 2, pressure pad 53 is a piece of rigid material approximately the size and shape of the interior space created by lid frame 51. There are four seating tabs 67 extending from pressure pad 53, two from each of the two side edges 69, and located such that they fit into the seating slots 65 in lid frame 51. A ramp 71 is integrally formed on the top surface of pressure pad 53. Ramp 71 has two faces 72 which slope from a ridge or peak 74 above the top surface of pressure pad 53 downward toward opposite side edges 69 of pressure pad 53, and to a depth slightly below the top surface of pressure pad 53. Each face 72 extends lengthwise from the center of pressure pad 53 approximately half the distance to side edges 69 of pressure pad 53. The width of ramp 71 is slightly greater than the width of a flat spring 55 located on top of the ramp 71. The remaining portion of the top surface of pressure pad 53 is substantially flat.

The flat spring 55 located on the top surface of pressure pad 53 only makes contact with the ridge 74 of ramp 71. To hold flat spring 55 in place, lid cover 57 is connected to lid frame 51, thereby pivotally securing both ends of flat spring 55. Lid cover 57 has a rectangular interior space 73 at least as wide as flat spring 55 to allow flat spring 55 room to flex upward as pressure pad 53 travels vertically upward inside lid 49.

Figure 3:
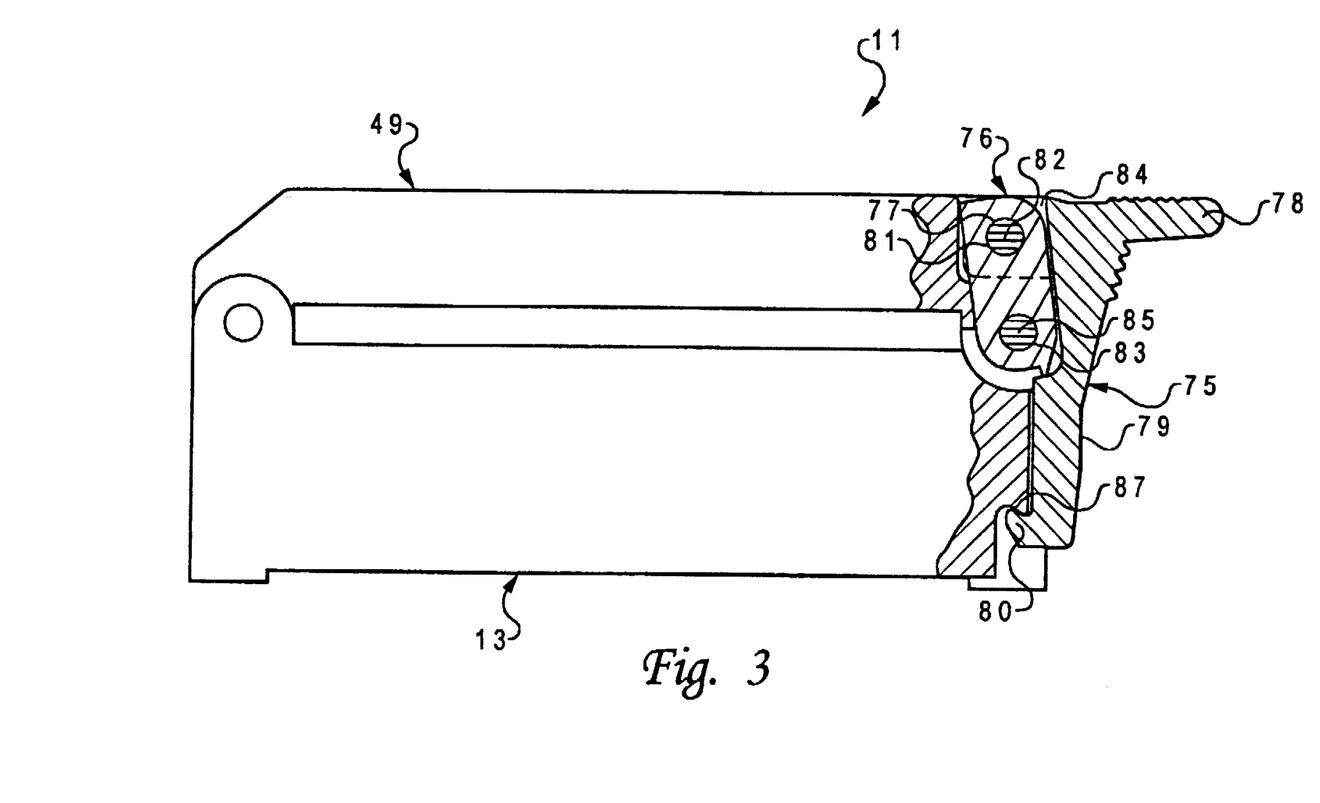
FIG. 3 is a side elevational view, partially broken away, of the present invention in the closed position.
Figure 4:
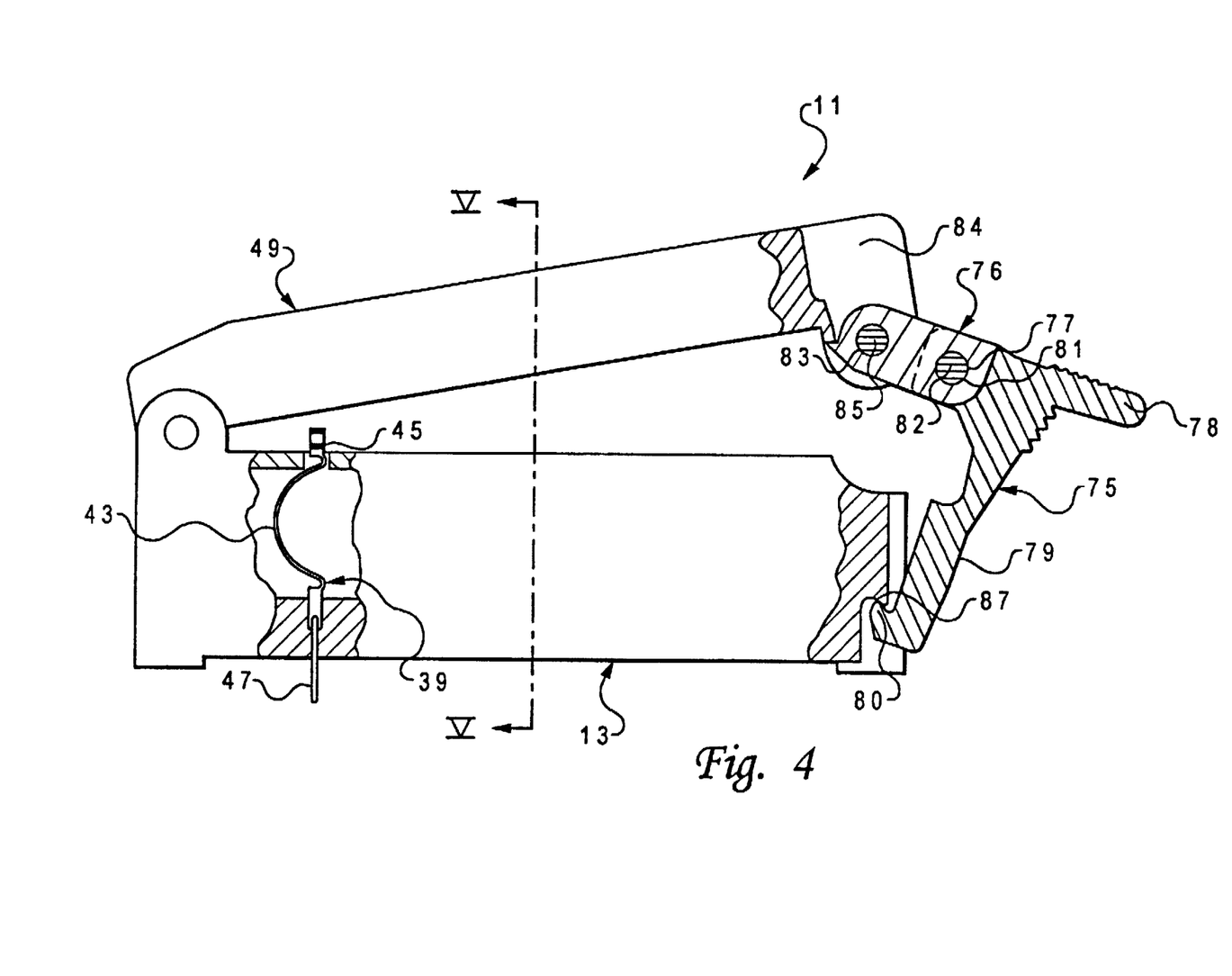
FIG. 4 is a side elevational view, partially broken away, of the present invention in a partially open position.

Also shown in FIGS. 2, 3 and 4 are a latch 75 and a link 76 that secure lid 49 in a closed position and provide a mechanical advantage when closing lid 49. Latch 75 has two hinge slots 77, a latch grip or handle 78 directly adjacent to hinge slots 77, and a leg 79 extending downward from hinge slots 77. Latch 75 has a latch hook 80 at its free end for engaging latch lip 87. Link 76 is generally T-shaped with a latch pin slot 81 at its narrow end that fits between the hinge slots 77 of latch 75 and pivotally connects link 76 to latch 75 with a cylindrical latch pin 82. The wider end of link 76 has a hinge pin slot 83 that fits between two hinge extensions 84 extending from the front wall 61 of lid frame 51 and pivotally connects link 76 to lid 49 with a cylindrical hinge pin 85. Link 76 provides a large mechanical advantage in forcing lid 49 closed because the distance between the applied force on latch handle 78 and hinge slot 77 is significantly larger than the distance between latch pin slot 81 and hinge pin slot 83 on link 76. An even greater mechanical advantage could be created by increasing the difference between these distances.

In operation, lid 49 is pivotally connected from the back wall 63 of lid frame 51 to the back wall 27 of base 13 and base 13 is attached to a circuit board (not shown). FIGS. 3 and 4 demonstrate how to open and close test socket 11. To close lid 49, latch hook 80 is first hooked under latch lip 87 in the front wall 23 of base 13 as shown in FIG. 4. Then lid 49 is forced until latch 75 is oriented in a substantially vertical position. At that point, latch handle 78 is forced upward, thereby rotating latch pin 82 over hinge pin 85 and locking latch 75 into position. To open lid 49, latch handle 78 is pulled downward, thereby rotating latch pin 82 back over hinge pin 85. Then latch hook 80 is removed from latch lip 87 and lid 49 is rotated away from base 13.

When lid 49 is in an open position, an integrated circuit is placed on nest 15 such that contact pins 39 make an electrical connection between the integrated circuit and the circuit board. As shown in FIG. 5, nest 15 will be in an upper at rest position, urged upward by the six coil springs 42, with leg ends 33 engaging upper shoulders 38 of the base recesses 37. Inside lid 49, pressure pad 53 will be in a lower at rest position, urged downward by flat spring 55. Seating tabs 67 of pressure pad 53 will be in contact with shoulders on the seating slots 65 of lid frame 51. FIG. 4 illustrates test socket 11 in only a partially open position, but the sole difference between this and a fully open position is that latch hook 80 has been placed under latch lip 87 in the front wall 23 of base 13. Just as in the fully open position, no downward force is applied to lid 49 or the integrated circuit in a partially open position.

When lid 49 is closing, pressure pad 53 contacts the integrated circuit and forces nest 15 downward against coil springs 42 and contact pins 39 until it bottoms out on top of the walls 21 of nest support 17. At that point, if additional vertical space is still needed to accommodate the thickness of the integrated circuit, pressure pad 53 will be forced upward, deflecting flat spring 55. The force required to move pressure pad 53 and deflect flat spring 55 upward is greater than the force required to deflect nest 15 downward.

There are several advantages of the present invention over the invention described in the prior art. First, incorporating a "floating" nest evenly spreads the dynamic forces applied to the integrated circuit across its surface and helps to minimize the damaging effects of any non-normal thereby protecting the integrated circuit while closing the lid. Second, the spring-loaded pressure pad in the lid provides added protection against damaging the integrated circuit when the test socket is closed. Allowing vertical movement of the pressure pad relative to the lid works not only to further equalize the forces applied to the integrated circuit, but also will accommodate an integrated circuit with a maximum tolerance thickness. Finally, separating the single platform into a nest and a nest support provides a positive stop for blocking the downward movement of the nest at a selected distance.

While the invention has been shown in only some of its forms, it should be apparent to those skilled in the art that it is not so limited but is susceptible to various changes without departing from the scope of the invention. For example, the same result can be accomplished by mounting the flat spring to the pressure pad and the deflector to the lid with the ridge of the deflector pointing downward.

We claim:

1. An improved test socket for integrated circuits, comprising in combination:

a base;

a lid pivotally connected to the base and rotatable between a closed position and an open position;

a platform carried by the base for supporting the integrated circuit below the lid;

a plurality of electrical contacts extending through the platform for electrical connection to the integrated circuit;

a pressure pad forming a portion of the lid for forcing the integrated circuit against the platform and the electrical contacts when the lid is closed;

lid compliance means for permitting independent movement of the lid relative to the pressure pad as a closure force is applied to the lid; and latching means for securing the lid in the closed position;

the lid compliance means comprising:

a flat spring;

a deflector in contact with the flat spring; and of the flat spring and deflector being retained by the pressure pad and the other of the flat spring and deflector being retained by the lid, wherein a force of sufficient magnitude applied to the lid while the pressure pad is stationary causes the deflector to bend the flat spring, allowing independent movement of the lid relative to the pressure pad.

2. A test socket according to claim 1 further comprising base compliance means for retaining the platform relative to the base at a rest position and for permitting movement of the platform toward the base from the rest position while the lid is moved to the closed position.

3. A test socket according to claim 2 wherein the base compliance means comprises:

a plurality of vertical holes formed in the base and located beneath the platform; and a plurality of coil springs, each of the coil springs positioned in one of the vertical holes such that one end of each of the coil springs extends out of the hole and contacts the platform, wherein each of the coil springs exerts a force on the platform in a direction away from the base.

4. A test socket according to claim 2 wherein the base compliance means comprises:

a plurality of legs depending from the platform toward the base, which legs terminate in projections extending substantially perpendicular to the legs; and a plurality of shoulders formed in the base for interacting with the leg projections to permit movement of the legs toward the base and away from base a selected distance.

5. A test socket according to claim 1 wherein the platform comprises:

a nest carried in the base for supporting the integrated circuit and moveable toward and away from a floor of the base;

the nest having a substantially flat upper surface and a plurality of legs depending from the nest toward the base, which legs terminate in projections extending substantially perpendicular to the legs; and a nest support having at least two walls for supporting the nest, the walls having lower edges in contact with the base and upper edges in contact with the upper surface of the nest, wherein the nest support blocks the downward movement of the nest at a selected distance before the projections of the legs contact the floor of the base.

6. A test socket according to claim 1 wherein the deflector is mounted to an upper surface of the pressure pad and the flat spring is mounted to the lid.

7. A test socket according to claim 1 wherein:

the deflector comprises a ramp portion on an upper surface of the pressure pad;

the flat spring has opposite side edges which locate on opposite shoulders formed in the lid; and a lid cover secures to the lid and retains the side edges of the flat spring on the shoulders of the lid.

8. A test socket according to claim 1 further comprising base compliance means for retaining the platform relative to the base at a rest position and for permitting movement of the platform toward the base from the rest position while the lid is moved to the closed position, wherein the force required for the lid compliance means to allow movement of the lid relative to the pressure pad is greater than the force required for the base compliance means to allow movement of the platform relative to the base.

9. A test socket according to claim 1 wherein the latching means comprises:

a lip on the base;

a link;

a latch pivotally connected to the link, the latch having a hook on a lower end for engaging the lip;

a handle on the latch wherein a closing force may be applied to the latch; and the link being pivotally connected to the lid, wherein the distance between the pivotal connection of the link to the lid and the pivotal connection of the link to the latch is smaller than the distance between the pivotal connection of the link to the latch and the handle on the latch, such that a mechanical advantage is created while applying the force to the handle to close and secure the lid.

10. An improved test socket for integrated circuits, comprising in combination:

a base having a plurality of walls and a floor;

a lid pivotally connected to the base and moveable between a closed position and an open position;

a platform carried by the base for supporting the integrated circuit below the lid;

base compliance means for retaining the platform relative to the floor of the base at a rest position and for permitting movement of the platform toward the floor from the rest position while the lid is moved to the closed position;

a plurality of electrical contacts extending through the platform for electrical connection to the integrated circuit;

a pressure pad forming a portion of the lid, having a lower surface for contact with the integrated circuit when the lid is in the closed position, the pressure pad being moveable relative to the lid from a rest position;

latching means for securing the lid in the closed position;

a flat spring having opposite side edges and a central portion;

a deflector in contact with the central portion of the flat spring; and one of the flat spring and deflector being mounted to the pressure pad and the other of the flat spring and deflector being mounted to the lid, such a downward closure force of sufficient magnitude applied to the lid while the pressure pad is stationarily in abutment with the integrated circuit and the platform causes the deflector to bend the flat spring, allowing downward movement of the lid relative to the pressure pad from a rest position.

11. A test socket according to claim 10 wherein the platform comprises:

a nest carried in the base for supporting the integrated circuit and moveable toward and away from the floor of the base;

the nest having a substantially flat upper surface and a plurality of legs depending from the nest toward the base, which legs terminate in projections extending substantially perpendicular to the legs; and a nest support having at least two walls for supporting the nest, the walls having lower edges in contact with the base and upper edges in contact with the upper surface of the nest, wherein the nest support blocks the downward movement of the nest at a selected distance before the projections of the legs contact the floor of the base.

12. A test socket according to claim 10 wherein the base compliance means comprises:

a plurality of vertical holes formed in the walls of the base and located beneath the platform; and a plurality of coil springs, each one of the coil springs being seated in one of the vertical holes, each of the coil springs having one end extending out of the hole and contacting the platform, wherein the coil springs force the platform away from the base while at the rest position.

13. A test socket according to claim 10 wherein the base compliance means comprises:

a plurality of legs depending from the platform toward the floor of the base, which legs terminate in projections extending substantially perpendicular to the legs; and a plurality of shoulders formed in the walls of the base for interacting with the leg projections to permit movement of the legs toward and away from the floor of the base a selected distance.

14. A test socket according to claim 10 wherein the deflector comprises:

two oppositely sloping ramp portions on an upper surface of the pressure pad forming a central ridge which is parallel to the side edges of the flat spring; and wherein the flat spring is retained only at its side edges, allowing a central portion of the flat spring to be engaged and deflected by the ridge of the deflector.

15. A test socket according to claim 10 wherein the deflector comprises:

two oppositely sloping ramp portions on an upper surface of the pressure pad forming a central ridge which is parallel to the side edges of the flat spring; and wherein a lid cover secures to the lid and retains the flat spring only at its side edges, allowing a central portion of the flat spring to be engaged and deflected by the ridge of the deflector.

16. A test socket according to claim 10 wherein the force required for moving the pressure pad from the rest position is greater than the force required for moving the platform from the rest position.

17. A test socket according to claim 10 wherein the latching means comprises:

a lip on the base;

a link;

a latch pivotally connected to the link, the latch having a hook on a lower end for engaging the lip;

a handle on the latch wherein a closing force may be applied to the latch; and the link being pivotally connected to the lid, wherein the distance between the pivotal connection of the link to the lid and the pivotal connection of the link to the latch is smaller than the distance between the pivotal connection of the link to the latch and the handle on the latch, such that a mechanical advantage is created while applying the force to the handle to close and secure the lid.

18. A test socket for integrated circuits, comprising in combination:

a base having a lower surface and four upright walls;

a lid pivotally connected to the base and moveable between a closed position and an open position;

a nest located below the lid and having an upper surface for supporting the integrated circuit, the nest having a peripheral edge;

a plurality of coil springs;

a plurality of cylindrical holes formed in the base, each locating and supporting one of the coil springs below the nest, wherein each of the coil springs extends out of the hole into engagement with the peripheral edge of the nest to force the nest away from the lower surface of the base while at a rest position;

four legs depending downward from the nest toward the base and being positioned at evenly spaced intervals around the peripheral edge of the nest, wherein each leg terminates in a projection extending substantially perpendicular to the leg and beyond the peripheral edge of the nest;

a plurality of shoulders formed in the walls of the base for interacting with the leg projections to permit movement of the legs toward the base and away from the floor of the base a selected distances;

resilient electrical contacts extending through the nest for electrical connection to the integrated circuit;

a nest support having three walls for supporting the nest, the walls lower edges in contact with the base and upper edges in contact with the upper surface of the nest, wherein the nest support blocks the downward movement of the nest at a selected distance before the projections of the legs contact the lower surface of the base;

a pressure pad forming a portion of the lid, having an upper surface, a lower surface for contact with the integrated circuit when the lid is in the closed position, two opposite side edges, and a central portion;

a flat spring having opposite side edges and a central portion;

a ramp being integrally formed in the upper surface of the pressure pad, having a ridge at the central portion of the pressure pad and two downward sloping surfaces, each surface sloping toward an opposite side edge of the pressure pad, the ridge being in contact with the central portion of the flat spring;

the side edges of the flat spring being retained by the lid, allowing a selected deflection distance of the flat spring and a corresponding downward movement of the lid relative to the pressure pad when a downward force of sufficient magnitude is applied to the lid while the pressure pad is stationarily in abutment with the integrated circuit and the nest; and latching means for securing the lid relative to the base and for retaining the pressure pad in contact with the integrated circuit.

19. A test socket according to claim 18 wherein the latching means comprises:

a lip on the base;

a link;

a latch pivotally connected to the link, the latch having a hook on a lower end for engaging the lip;

a handle on the latch wherein a closing force may be applied to the latch; and the link being pivotally connected to the lid, wherein the distance between the pivotal connection of the link to the lid and the pivotal connection of the link to the latch is smaller than the distance between the pivotal connection of the link to the latch and the handle on the latch, such that a mechanical advantage is created while applying the force to the handle to close and secure the lid.

* * * * *

UNITED STATES PATENT AND TRADEMARK OFFICE
CERTIFICATE OF CORRECTION

PATENT NO.: 5,788,526

DATED: August 4, 1998

INVENTOR(S): Richard D. Twigg and Steven D. Mitchem

It is certified that error appears in the above-identified patent and that said Letters Patent is hereby corrected as shown below:

Column 5, line 34, "of" should read --one of--

Column 5, line 64, "away from base" should read --away from the base--

Column 7, line 11, "such a downward" should read --such that a downward--

Column 8, line 54, "walls lower" should read --walls having lower--

Signed and Sealed this

Twenty-third Day of March, 1999

Attest:

Q. TODD DICKINSON

*Attesting Officer*  *Acting Commissioner of Patents and Trademarks*